United States Patent
Nosaka

[19]

[11] Patent Number: 6,115,264
[45] Date of Patent: Sep. 5, 2000

[54] MULTILAYER HIGH FREQUENCY ELECTRONIC PARTS

[75] Inventor: Koji Nosaka, Fukui, Japan

[73] Assignee: Murata Manufacturing Co., Ltd., Kyoto, Japan

[21] Appl. No.: 09/200,202

[22] Filed: Nov. 25, 1998

[30] Foreign Application Priority Data

Dec. 19, 1997 [JP] Japan ................................. 9-350283

[51] Int. Cl.[7] .................................................. H05K 1/14
[52] U.S. Cl. .................. 361/821; 361/301.4; 361/306.3; 361/308.1; 361/321.2; 361/321.3; 336/200; 333/172; 333/181; 333/185
[58] Field of Search ................................ 361/821, 301.4, 361/301.5, 306.3, 308.1, 321.2, 321.3, 765, 766, 782, 763; 336/200; 333/172, 181, 185

[56] References Cited

U.S. PATENT DOCUMENTS

| | | | |
|---|---|---|---|
| 5,099,387 | 3/1992 | Kato et al. ................................. | 361/321 |
| 5,250,923 | 10/1993 | Ushiro et al. .............................. | 336/83 |
| 5,278,526 | 1/1994 | Ikeda ......................................... | 333/185 |
| 5,497,137 | 3/1996 | Fujiki ......................................... | 336/200 |
| 5,610,565 | 3/1997 | Maeda et al. ............................. | 333/185 |
| 5,834,992 | 11/1998 | Kato et al. ................................. | 333/185 |
| 5,880,662 | 3/1999 | Person et al. ............................. | 336/200 |

FOREIGN PATENT DOCUMENTS

| | | |
|---|---|---|
| WO 9712440 | 4/1997 | European Pat. Off. . |
| 0 926 933 A1 | 6/1999 | European Pat. Off. . |

Primary Examiner—Leo P. Picard
Assistant Examiner—David Foster
Attorney, Agent, or Firm—Joseph R. Keating, Esq.; Keating & Bennett, LLP

[57] ABSTRACT

A multilayer high frequency electronic component having a greatly reduced resistance component of a signal line which functions as an inductor is constructed such that the signal line includes at least two conductor patterns provided on the surface of insulation sheets. The at least two conductor patterns have substantially the same shape and different pattern widths. The at least two conductor patterns are arranged to extend continuously across an insulation layer.

20 Claims, 3 Drawing Sheets

FIG. 5
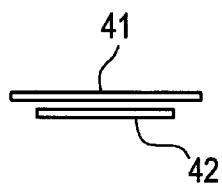
FIG. 6
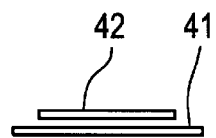
FIG. 7
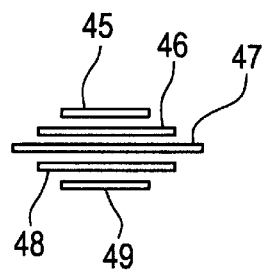
FIG. 8
FIG. 9
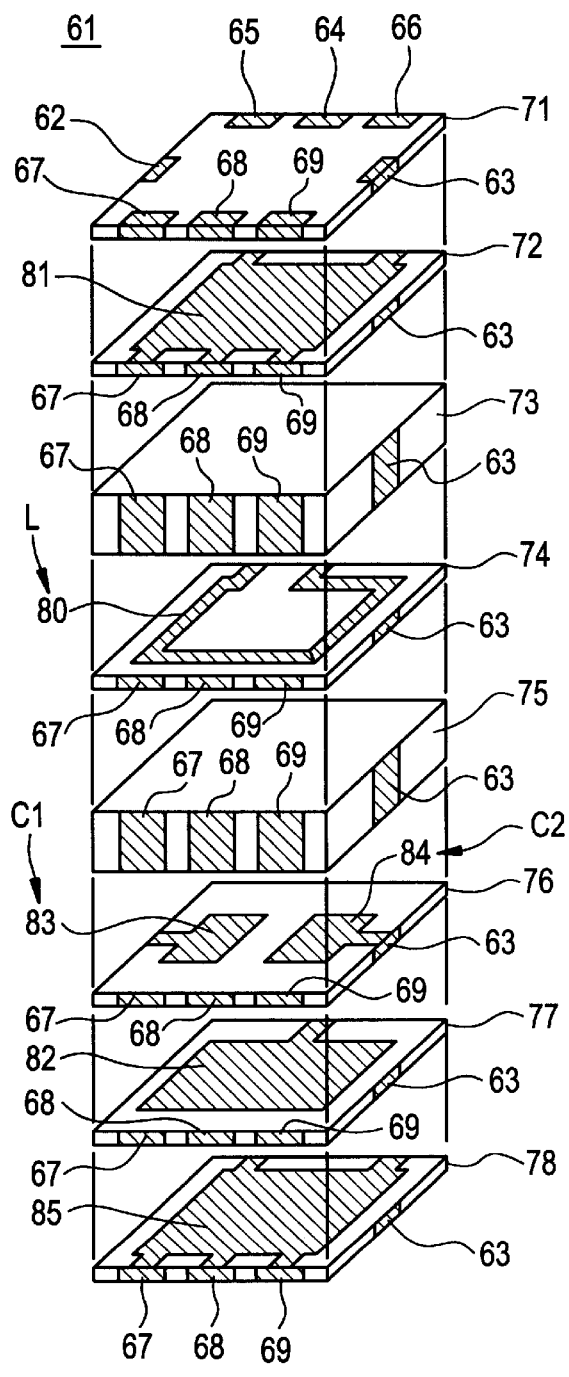

MULTILAYER HIGH FREQUENCY ELECTRONIC PARTS

BACKGROUND OF THE INVENTION

1. Field of the Invention

The present invention relates to a multilayer high frequency electronic component, in particular, a multilayer high frequency electronic component in which an inductor is integrated therein, similar to an LC filter which is built into a mobile communication device.

2. Description of the Related Art

A conventional multilayer LC filter 61 shown FIG. 9 includes a signal line 80 arranged to function as an inductor L and defined by only one conductor pattern on the surface of a ceramic sheet 74. Capacitor conductors 83, 84 are provided on the surface of a ceramic sheet 76, while a common capacitor conductor 82 is provided on the surface of a ceramic sheet 77. The capacitor conductor 83 and the common capacitor conductor 82 constitute an input side capacitor C1 across the ceramic sheet 76. Similarly, the capacitor conductor 84 and the common capacitor conductor 82 also constitute an output side capacitor C2 across the ceramic sheet 76. In addition, ground conductors 81, 85 are provided on the surface of the ceramic sheets 72, 78. The signal line 80 and the conductors 81–85 are disposed on the surface of the ceramic sheets 72, 74, 76–78 by a method such as a thick film printing method.

After the ceramic green sheets 71–78 of the above-mentioned constitution are laminated and press-fitted, they are integratedly baked to form a laminated body. An input external electrode 62 and an output external electrode 63 are disposed on right and left end portions of the laminated body, respectively. The external input electrode 62 is connected to the capacitor conductor 83 while the external output outer electrode 63 is connected to the capacitor conductor 84. An external relay electrode 64 and external ground outer electrodes 65, 66 are disposed on the side surface on the distal side of the laminated body. The external relay electrode 64 is connected to the signal line 80 and the common capacitor conductor 82. The external ground electrode 65 is connected to the signal line 80 and the ground conductors 81, 85, while the external ground electrode 66 is connected to the ground conductors 81, 85. External ground electrodes 67, 68, 69 are disposed on the side surface on the proximal side of the laminated body. The external ground electrodes 67, 68, 69 are connected to the ground conductors 81, 85, respectively.

In the conventional multilayer LC filter 61 having the above-described constitution, there is a problem that no satisfactory Q characteristic of the inductor can be achieved because of the reasons described below.

(1) The film thickness of the signal line 80 arranged to function as the inductor L is as thin as 20–30 $\mu$m at a maximum film thickness portion even though the thick film printing method capable of increasing the film thickness is used. Thus, the resistance component of the signal line 80 is large, and an excellent Q characteristic of the inductor cannot be obtained.

(2) When the high frequency current flows in the signal line 80, the flow of the high frequency current is concentrated at an edge portion of the signal line 80 due to the skin effect. Thus, the sectional area of the signal line 80 is reduced, and the resistance component of the signal line 80 is further increased.

SUMMARY OF THE INVENTION

To overcome the problems described above, the preferred embodiments of the present invention provide a multilayer high frequency electronic component capable of reducing the resistance component of the signal line which functions as an inductor.

Preferred embodiments of the multilayer high frequency electronic component of the present invention are characterized in that a signal line which is arranged to function as an inductor is constituted by at least two conductor patterns having substantially the same shape and different pattern widths, and the at least two conductor patterns are arranged to extend continuously in the thickness direction across an insulation layer.

By constructing the signal line which is arranged to function as an inductor to include at least two conductor patterns, the sectional area of the signal line is greatly increased as compared to the conventional value, and the resistance component of the signal line is significantly reduced. Thus, the Q characteristic of the inductor is greatly improved. Further, by providing each conductor pattern with a different width, the relative position of edge portions of each conductor pattern is deviated in the width direction of the conductor pattern, and the skin effect of the edge portion of the conductor pattern is greatly reduced. Thus, concentration of the high frequency current at the edge portion is greatly reduced, the substantial sectional area of the signal line is significantly increased, and the resistance component of the signal line is further reduced.

These and other elements, features, and advantages of the preferred embodiments of the present invention will be apparent from the following detailed description of the preferred embodiments of the present invention, as illustrated in the accompanying drawings.

BRIEF DESCRIPTION OF THE DRAWINGS

FIG. 5 is an electric equivalent circuit of the multilayer high frequency electronic component illustrated in FIG. 2;

FIG. 6 is an enlarged sectional view of the signal line to illustrate another preferred embodiment of the multilayer high frequency electronic component of the present invention;

FIG. 7 is an enlarged sectional view of the signal line to illustrate further another preferred embodiment of the multilayer high frequency electronic component of the present invention;

FIG. 8 is an enlarged sectional view of the signal line to illustrate still another preferred embodiment of the multilayer high frequency electronic component of the present invention; and FIG. 9 is an explosive perspective view illustrating the constitution of the conventional multilayer high frequency electronic component.

DETAILED DESCRIPTION OF PREFERRED EMBODIMENTS

Preferred embodiments of a multilayer high frequency electronic component of the present invention are explained referring to the attached drawings. A first preferred embodiment is explained using an LC filter as an example of the multilayer high frequency electronic component.

Figure 1:
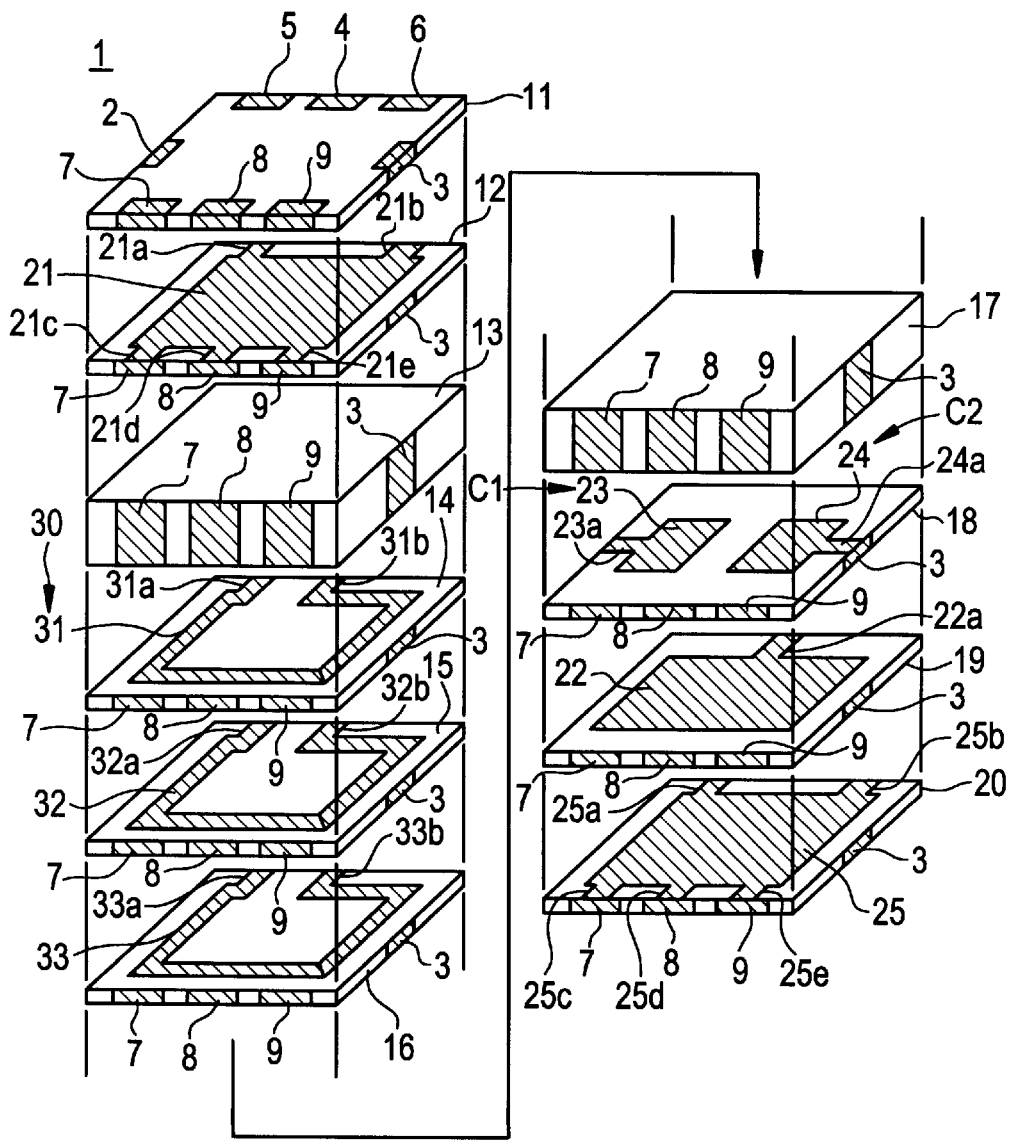
FIG. 1 is an explosive perspective view illustrating a preferred embodiment of a multilayer high frequency electronic component of the present invention.

As shown in FIG. 1, the LC filter 1 preferably includes insulation sheets 12, 20 on the surface of which ground conductors 21, 25 are provided, insulation sheets 14, 15, 16 on the surface of which conductor patterns 31, 32, 33 arranged to constitute a signal line 30 are provided, an insulation sheet 18 on the surface of which capacitor conductors 23, 24 are provided, an insulation sheet 19 on the surface of which a common capacitor conductor 22 is provided, insulation sheets 13, 17, and, a protective insulation sheet 11.

The signal line 30 functions as the inductor. In this example of preferred embodiments of the present invention, three conductor patterns 31, 32, 33 preferably constitute the signal line 30. The three conductor patterns 31, 32, 33 preferably have substantially the same shape, and are arranged substantially parallel to the outer periphery of the insulation sheets 14–16. First end portions 31a, 32a, 33a of the conductor patterns 31–33 are exposed on the left side of the distal side of the sheets 14–16. Second end portions 31b, 32b, 33b of the conductor patterns 31–33 are exposed at the approximate center portion of the distal side of the sheets 14–16, respectively. The pattern width of the conductor pattern 32 is preferably wider than that of the conductor patterns 31, 33.

The ground conductors 21, 25 are provided on a major portion of the surface of the insulation sheets 12, 20, respectively. The ground conductors 21, 25 are used to prevent noise from being radiated from the LC filter 1 to the external field and to prevent noise from entering the LC filter 1 from the external field. Lead parts 21a, 25a and lead parts 21b, 25b of the ground conductors 21, 25 are exposed at the left side portion and the right side portion of the distal side of the sheets 12, 20, respectively. Lead parts 21c, 25c, lead parts 21d, 25d, and lead parts 21e, 25e of the ground conductors 21, 25 are exposed at the left side portion, the approximate center portion, and the right side portion on the proximal side of the sheets 12, 20.

Lead portions 23a, 24a of capacitor conductors 23, 24 are exposed at the left side and the right side of the insulation sheet 18. A lead portion 22a of a common capacitor conductor 22 is exposed at the approximate center portion on the distal side of an insulation sheet 19. The capacitor conductor 23 and the common capacitor conductor 22 constitute an input side capacitor C1 across the sheet 18. Similarly, the capacitor conductor 24 and the common capacitor conductor 22 constitute an output side capacitor C2 across the sheet 18.

The conductor patterns 31–33 and the conductors 21–25 are formed preferably by applying the conductive paste such as Ag, Ag—Pd and Cu to the sheets 12, 14–16, 18–20, and drying the paste using the thick film printing method or the like. The insulation sheets 11–20 are preferably formed of magnetic material such as ferrite, or dielectric material such as ceramic.

Figure 2:
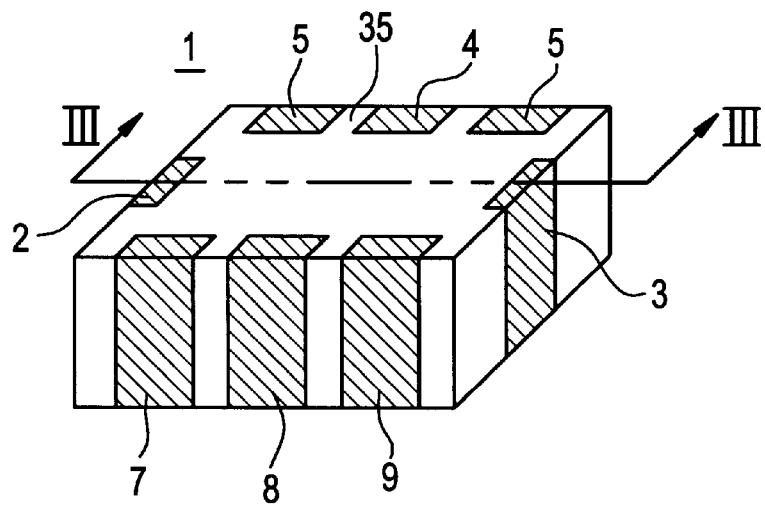
FIG. 2 is a perspective view of the multilayer high frequency electronic component illustrated in FIG. 1.

The insulation sheets 11–20 are laminated, and then, integratedly baked to form a laminated body 35 as indicated in FIG. 2. The external input electrode 2 and the external output electrode 3 are provided on the right and left end portions of the laminated body 35. The external relay electrode 4 and the external ground electrodes 5, 6 are provided at the approximate center portion, the left portion, and the right portion of the distal side of the laminated body 35, respectively. The external ground electrodes 7, 8, 9 are provided on the left portion, the approximate center part, and the right portion of the proximal side of the laminated body 35.

The external input electrode 2 and the external output electrode 3 are electrically connected to the lead portion 23a of the capacitor conductor 23 and the lead portion 24a of the capacitor conductor 24. The relay external electrode 4 is electrically connected to the end portions 31b, 32b, 33b of the conductor patterns 31, 32, 33, and the lead portion 22a of the common capacitor conductor 22. The ground external electrode 5 is electrically connected to the end portions 31a, 32a, 33a of the conductor patterns 31, 32, 33, and the lead portions 21a, 25a of the ground conductors 21, 25. The ground external electrodes 6, 7, 8, 9 are electrically connected to the lead portions 21b, 25b, the lead portions 21c, 25c, the lead portions 21d, 25d, and the lead portions 21e, 25e of the ground conductors 21, 25. The electrodes 2–9 are formed preferably by applying the conductive paste of Ag, Ag—Pd, Cu, Ni, etc., and then, baking it or performing dry plating thereof.

Figure 3:
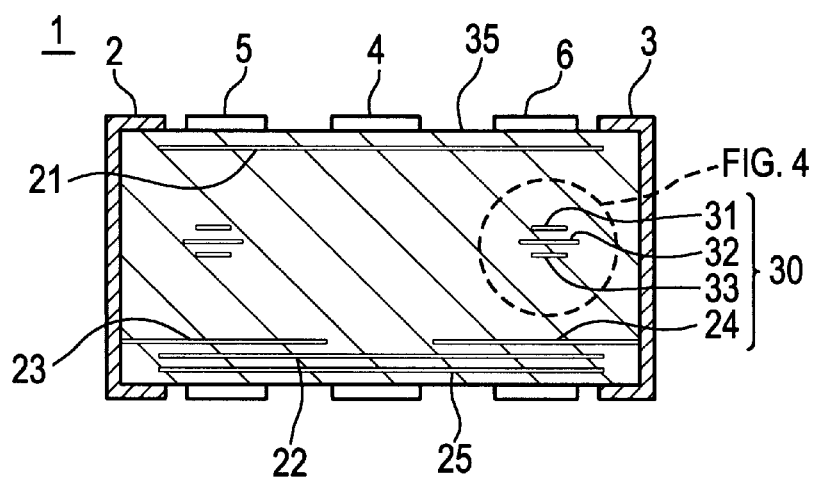
FIG. 3 is a sectional view taken along the line III—III in FIG. 2.
Figure 4:
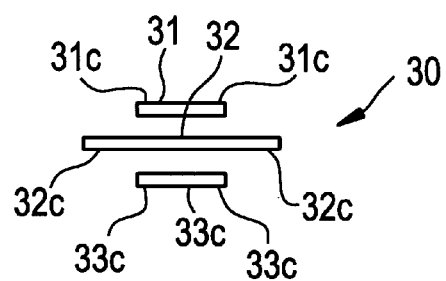
FIG. 4 is an enlarged sectional view of the signal line indicated in Region A in FIG. 3.

In the multilayer LC filter 1 of the above-described constitution, the conductor patterns 31–33 constituting the signal line 30 are arranged to extend continuously in the thickness direction as indicated in FIG. 3. The conductor pattern 32 having a relatively large pattern width is arranged between the conductor patterns 31, 33 each having a relatively small pattern width. FIG. 4 is an enlarged section of the signal line 30 indicated in Region A surrounded by the dotted line in FIG. 3. The edge portion 32c on each side of the conductor pattern 32 extends beyond the edge portions 31c, 33c on each side of the conductor patterns 31, 33. Because the signal line 30 which functions as the inductor includes three conductor patterns 31–33, the sectional area of the signal line 30 is greatly increased compared with the conventional value, the resistance component of the signal line 30 is significantly reduced, and the Q characteristic of the inductor is vastly improved.

In addition, the edge portion 32c on each side of the conductor pattern 32 is extended beyond the edge portions 31c, 33c on each side of the conductor patterns 31, 33 by setting the pattern width of the conductor pattern 32 larger than the pattern width of the conductor patterns 31, 33. The skin effect of the edge portion 32c of the conductor pattern 32 is eliminated as a result, and the phenomenon of the high frequency current being concentrated at the edge portions 32c is prevented. As a result, the sectional area, of the signal line 30 is greatly increased, and the resistance component of the signal line 30 is further reduced. Thus, the multilayer LC filter 1 with small insertion loss is obtained. FIG. 5 is an electric equivalent circuit of the LC filter 1.

The multilayer high frequency electronic component of preferred embodiments of the present invention is not limited to the above-mentioned embodiments, but can be changed in accordance with the spirit and scope of the present invention.

In the above-described preferred embodiment, the LC filter is provided as an example of the multilayer high frequency electronic component, but the preferred embodiments of the present invention are not limited thereto, and may include an inductor component, or a high frequency electronic component provided with a strip line which is the signal line having the inductor element.

The number of the conductor patterns used to constitute the signal line may be two as shown in FIG. 6 and FIG. 7. In this preferred embodiment, the arrangement of the conductor pattern 41 having a relatively large pattern width and the conductor pattern 42 having a relatively small pattern width in the thickness direction is not specified. In addition, the number of conductor patterns used to constitute the signal line may be 4 or more. As illustrated in FIG. 8, it is preferable that the pattern width of the conductor pattern 47 located at the approximate center in the thickness direction, and the pattern width becomes successively smaller as the conductor patterns 45, 46, 48, 49 located above and below the conductor pattern 47 are located farther away from the conductor pattern 47.

Further, in the above-described preferred embodiment, the ceramic sheet on which the electrode is provided is laminated, and then, integratedly baked, but the preferred embodiments of the present invention are not limited to this practice. A previously baked ceramic sheet may be used.

Alternatively, the multilayer high frequency electronic component may be manufactured by the manufacturing method described below. After the ceramic layer is formed of the paste-like ceramic material by a method such as printing, the paste-like conductive material is applied to the surface of the ceramic layer to form an arbitrary conductor pattern. Then, the paste-like ceramic material is applied over the conductor pattern to form the ceramic layer into which the conductor pattern is built. Similarly, the high frequency electronic component having the lamination structure can be obtained by successively applying the ceramic material in an overlapping manner.

As clearly explained above, because the signal line arranged to function as an inductor is constituted by at least two conductor patterns in preferred embodiments of the present invention, the sectional area of the signal line is greatly increased compared with the conventional value, and the resistance component of the signal line is significantly reduced. Thus, the Q characteristic of the inductor is vastly improved. Further, by changing the pattern width of each conductor pattern, the relative position of the edge portion of each conductor pattern is deviated in the width direction of the conductor pattern, and the skin effect of the edge part of the conductor pattern is significantly reduced. Thus, concentration of the high frequency current at the edge portion is prevented, the substantial sectional area of the signal line is greatly increased, and the resistance component of the signal line is further reduced. As a result, a multilayer high frequency electronic component with small insertion loss is obtained.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An electronic component comprising:
   a multilayered body;
   an inductor disposed in said multilayered body, the inductor including a signal line defined by at least two conductor patterns disposed at two different levels in said multilayered body, the at least two conductor patterns having substantially the same shape and different pattern widths, and
   an insulation layer disposed in said multilayered body, wherein said at least two conductor patterns are arranged to extend continuously across said insulation layer.

2. The electronic component according to claim 1, wherein the electronic component comprises an LC filter.

3. The electronic component according to claim 1, further comprising a plurality of insulation sheets, ground conductors, conductor patterns and capacitor conductors disposed in the multilayered body.

4. The electronic component according to claim 1, wherein each of the at least two conductor patterns has a first portion exposed at a first side of the multilayered body and a second portion exposed at an approximate center of the multilayered body.

5. The electronic component according to claim 1, wherein the at least two conductor patterns are separated from each other in a thickness direction of the multilayered body.

6. The electronic component according to claim 1, wherein the signal line is defined by at least three separate conductor patterns disposed at different levels within said multilayered body.

7. The electronic component according to claim 6, wherein the at least three conductor patterns have substantially the same shape and at least one of the three conductor patterns has a pattern width that is different from that of the others of the at least three conductor patterns.

8. The electronic component according to claim 6, wherein each of the at least three conductor patterns has a first portion exposed at a first side of the multilayered body and a second portion exposed at an approximate center of the multilayered body.

9. The electronic component according to claim 6, wherein the at least three conductor patterns are separated from each other in a thickness direction of the multilayered body and a middle one of the at least three conductor patterns has a pattern width that is larger than that of the others of the at least three conductor patterns.

10. The electronic component according to claim 6, wherein a middle one of the at least three conductor patterns has an edge portion that extends beyond edge portions of the others of the at least three conductor patterns.

11. The electronic component according to claim 1, wherein the signal line is defined by at least four separate conductor patterns disposed at different levels within said multilayered body.

12. The electronic component according to claim 11, wherein the at least four conductor patterns are separated from each other in a thickness direction of the multilayered body and a middle one of the at least four conductor patterns has a pattern width that is larger than that of the others of the at least four conductor patterns.

13. The electronic component according to claim 12, wherein the pattern widths of the ones of the at least four conductor patterns located on either side of the middle one of the at least four conductor patterns decrease according to an increasing distance away from the middle one of the at least four conductor patterns.

14. The electronic component according to claim 1, wherein said at least two conductor patterns are arranged to sandwich said insulation layer therebetween.

15. An electronic component comprising:
   a multilayered body:
   an inductor disposed in said multilayered body, the inductor including a signal line defined by at least two conductor patterns disposed at two different levels in said multilayered body, the at least two conductor patterns having substantially the same shape and different pattern widths, wherein
   one of the at least two conductor patterns has an edge portion that extends beyond an edge portion of the other of the at least two conductor patterns.

16. An electronic component comprising:
   a multilayered body including a plurality of insulating layers;
   an inductor disposed in said multilayered body, the inductor including a signal line defined by at least three conductor patterns disposed at different levels in said multilayered body, two of the at least three conductor patterns having substantially the same shape and different pattern widths, and the two of the at least three patterns each having an end which extends to a common position at a common edge of the multilayered body such that the arrangement of the two of the least three conductor patterns on the respective insulating layers is substantially the same.

17. The electronic component according to claim 16, wherein the electronic component comprises an LC filter.

18. An electronic component comprising:

a multilayered body including a plurality of insulating layers;

an inductor disposed in said multilayered body, the inductor including a signal line defined by at least four conductor patterns disposed at different levels in said multilayered body, two of the at least four conductor patterns having substantially the same shape and different pattern widths, and the two of the at least four patterns each having an end which extends to a common position at a common edge of the multilayered body such that the arrangement of the two of the least four conductor patterns on the respective insulating layers is substantially the same.

19. The electronic component according to claim 18, wherein the electronic component comprises an LC filter.

20. The electronic component according to claim 18, wherein at least three of the at least form conductor patterns have different pattern widths.

* * * * *